United States Patent
Reusswig (10) Patent No.: US 12,190,959 B2
(45) Date of Patent: Jan. 7, 2025

(54) ERASE SUSPEND WITH CONFIGURABLE FORWARD PROGRESS

(71) Applicant: Micron Technology, Inc., Boise, ID (US)

(72) Inventor: Phil Reusswig, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 318 days.

(21) Appl. No.: 17/893,755

(22) Filed: Aug. 23, 2022

(65) Prior Publication Data

US 2024/0071513 A1 Feb. 29, 2024

(51) Int. Cl.
*G11C 16/16* (2006.01)
*G11C 16/24* (2006.01)
*G11C 16/34* (2006.01)

(52) U.S. Cl.
CPC .............. *G11C 16/16* (2013.01); *G11C 16/24* (2013.01); *G11C 16/349* (2013.01)

(58) Field of Classification Search
CPC ....... G11C 16/16; G11C 16/24; G11C 16/349; G11C 16/26; G11C 16/0483; G11C 16/32; G11C 16/3445

USPC ..................................................... 365/185.29
See application file for complete search history.

(56) References Cited

U.S. PATENT DOCUMENTS

| | | | |
|---|---|---|---|
| 2018/0350440 A1* | 12/2018 | Jang | G11C 16/345 |
| 2018/0374551 A1* | 12/2018 | Hu | G11C 16/3459 |
| 2020/0409836 A1* | 12/2020 | You | G06F 12/0261 |
| 2021/0035642 A1* | 2/2021 | Rayaprolu | G11C 16/3495 |
| 2023/0045340 A1* | 2/2023 | Kumano | G11C 16/26 |

FOREIGN PATENT DOCUMENTS

| | | | | |
|---|---|---|---|---|
| EP | 3023990 A1 * | 5/2016 | | G11C 16/16 |
| KR | 102294042 B1 * | 8/2021 | | G11C 16/16 |

* cited by examiner

*Primary Examiner* — Fernando Hidalgo
(74) *Attorney, Agent, or Firm* — Schwegman Lundberg & Woessner, P.A.

(57) ABSTRACT

Aspects of the present disclosure configure a memory sub-system processor to manage memory erase operations. The processor accesses a configuration register to identify a quantity of memory slices to erase. The processor divides a set of memory components into a plurality of portions based on the identified quantity of memory slices to erase and performs one or more read operations in association with the memory sub-system between erasure of each of the plurality of portions of the set of memory components.

20 Claims, 5 Drawing Sheets

ERASE SUSPEND WITH CONFIGURABLE FORWARD PROGRESS

TECHNICAL FIELD

Embodiments of the disclosure relate generally to memory sub-systems and, more specifically, to managing erase operations on memory systems.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data on the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure configure a system component, such as a memory sub-system processor or controller and/or a media controller, to distribute erasure of a set of memory slices across configurable portions or chunks to increase memory read operation performance and/or other increase or improve performance of memory operations. This ensures that performance of the memory system remains optimal and ensures memory operations meet certain minimum quality of service (QoS) limitations with minimal hardware additions. This improves the overall efficiency of operating and implementing the memory sub-system.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices (e.g., memory dies) that store data. The host system can send access requests (e.g., write command, read command) to the memory sub-system, such as to store data at the memory sub-system and to read data from the memory sub-system. The data (or set of data) specified by the host is hereinafter referred to as "host data," "application data," or "user data."

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data." "User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

Many different media management operations can be performed on the memory device. For example, the media management operations can include different scan rates, different scan frequencies, different wear leveling, different read disturb management, different near miss error correction (ECC), and/or different dynamic data refresh. Wear leveling ensures that all blocks in a memory component approach their defined erase-cycle budget at the same time, rather than some blocks approaching it earlier. Read disturb management counts all of the read operations to the memory component. If a certain threshold is reached, the surrounding regions are refreshed. Near-miss ECC refreshes all data read by the application that exceeds a configured threshold of errors. Dynamic data-refresh scan reads all data and identifies the error status of all blocks as a background operation. If a certain threshold of errors per block or ECC unit is exceeded in this scan-read, a refresh operation is triggered. Memory operations can also include erase operations, such as erase suspend/resume operations.

A memory device can be a non-volatile memory device. A non-volatile memory device is a package of one or more dice (or dies). Each die can be comprised of one or more planes. For some types of non-volatile memory devices (e.g., NAND devices), each plane is comprised of a set of physical blocks. For some memory devices, blocks are the smallest area than can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which are raw memory devices combined with a local embedded controller for memory management within the same memory device package.

There are challenges in efficiently managing or performing media management operations on typical memory devices when performing erasure or erase operations. Typically, such erase operations are performed with respect to 16 memory slices or blocks at a time. To erase a given memory slice of a set of memory slices, various operations or erase phases need to be performed. Specifically, the bitline (BL) associated with the set of memory slices needs to be charged (known as the BL charge phase), and following the BL charge phase, an erase pulse is applied to each of the set of memory slices. After the set of memory slices is erased by the erase pulse, the BL is discharged and an erase verify phase or an operation is performed to ensure that the data from the set of memory slices has been erased. While each of these phases are performed (except, in some cases, the BL discharge or erase verify phases), read operations cannot be serviced. As such, while a memory device is being erased, other operations, such as read operations, cannot be serviced or performed. This can adversely impact the QoS of servicing read operations, which may need to be performed within a threshold minimum amount of time. In order to address these issues, certain systems implement different approaches to suspending memory erase (e.g., pausing erasure operations or phases of the memory device) to allow for one or more read operations to be services and then resuming the erase operations.

A first approach is referred to as on-demand erase suspend/resume. In this approach, an erase operation is suspended immediately upon receiving a request to suspend from a memory controller. In such cases, a read operation can be serviced very quickly, such as within 100 us (microseconds) upon receiving the suspend command. The memory controller (e.g., firmware controller) in this approach instructs the memory devices, such as the media controller of individual memory dies, to suspend erasure operations and subsequently resume erasure operations after one or more read operations are serviced. The drawback of such an approach is the additional burden imposed on the firmware or memory controller in having to not only instruct the media controllers to suspend erase operations but also resume erase operations. Namely, the media controllers have no mechanism to maintain forward progress of erasing the memory devices. Forward progress can refer to the NAND state machine moving forward (erase loop counter, erase loop slice counter, erase verify operations being performed). For example, if NAND receives an on-demand erase suspend command during certain erase phases, such as a BL charge phase or during an erase verify phase, no erase forward progress will occur. The lack of erase forward progress could result in a perpetual erase (no erase forward progress) that eventually causes system timeout. Some systems address these issues by adding delays between separate on-demand erase suspend/resume commands or limiting the number of total on-demand erase suspend/resume commands that can be received or serviced per erase. Adding such delays or restricting the number of suspend operations can still result in wasted phases being performed, which leads to inefficiencies. For example, if a BL charge phase is performed and a suspend command is received, the BL needs to be discharged to service a read request. The total time spent on the BL charge and discharge phases is wasted as no erase operations were completed.

A second approach is referred to as forward progress erase suspend/resume. In this approach, forward progress of the memory erase operations is guaranteed. Specifically, forward progress erase suspend/resume automatically suspends the erase at defined points within the erase. These suspend points are after an erase loop (e.g., BL charge, erase pulse, BL discharge phases complete) and after an erase verify phase completes. The forward progress erase suspend/resume can also be referred to as segmented erase and is automatically suspended and manually resumed in response to a resume command from the memory controller. In this second approach, the media controller suspends performing erase operations automatically without receiving a specific suspend command from the memory controller which allows the media controller to complete erasing the specified segments or memory without wasting any phases. Once the erase operations are suspended, one or more read operations can be serviced and the erase operations are resumed when a command to resume is received from the memory controller (e.g., the controller coupled to each of a plurality of memory dies or memory components). This approach not only guarantees forward progress, but the erase behavior is very predictable (modelling, HW timer prediction). While this approach generally works well, the QoS or time for servicing read operations is adversely impacted as a predefined set of slices needs to be erased before a read operation is serviced. Depending on the product requirements, the latency for an erase loop might not be acceptable for the minimum QoS of the product for read operations.

Aspects of the present disclosure address the above and other deficiencies by providing a media controller or memory controller that includes a configuration register that enables dynamic and customized control over the duration of a forward progress erase suspend/resume approach to erasing memory devices. Specifically, the media controller can allow different applications or hosts to store and/or modify configuration information that specifies the total quantity of slices of memory that can be erased in each erase cycle. This way, forward progress of memory erasure can be maintained but also can be dynamically controlled based on the QoS needs of different applications. For example, the media controller can perform erasure operations (e.g., completing a BL charge, erase pulse, and BL discharge) with respect to a customized size or configurable quantity of memory slices and can automatically suspend performing the erasure operations to allow for one or more read operations to be serviced after the configurable quantity of memory slices have been erased. Then, when a resume command is received, the media controller continues the previously initiated erase operation to continue erasing another quantity of memory slices. This enables multiple products to share the same NAND trim (or memory subsystem) but have different QoS for read requirements by allowing the different products to configure the forward progress erase suspend behavior. For example, a client SSD might choose suspend latency of 1.6 ms corresponding to a first quantity of slices that are erased per cycle, gaming SSD might choose 1.0 ms corresponding to a second quantity of slices that are erased per cycle, and a boot SSD might choose 0.7 ms corresponding to a third quantity of slices that are erased per cycle based on their individual requirements. This increases the efficiency of operating memory systems by allowing the quantity of read operations serviced to be customized to the particular application or product rather than applying a one-size-fits-all approach to memory erase operations.

In some examples, the media controller (e.g., embedded or implemented on a memory die) and/or a memory controller (firmware) initiates an erase operation to perform in association with a set of memory components. The media controller accesses a configuration register to identify a quantity of memory slices to erase. The media controller divides the set of memory components into a plurality of portions based on the identified quantity of memory slices to erase. The media controller performs one or more read operations in association with the memory sub-system between erasure of each of the plurality of portions of the set of memory components.

In some examples, the media controller applies a first erase pulse to a first portion of the plurality of portions. The media controller suspends the erase operation associated with the set of memory components and performs the one or more read operations. In some cases, after performing the one or more read operations, the media controller applies a second erase pulse to a second portion of the plurality of portions. In some cases, sizes of each of the plurality of portions are equal. In some cases, the erase operation corresponds to erasing 16 memory slices and each of the plurality of portions corresponds to a subset of the 16 memory slices.

In some examples, the media controller receives configuration information from a host specifying the quantity of memory slices. In response, the media controller stores the configuration information in the configuration register. In some cases, the media controller and the set of memory components are implemented on a same memory die. In some cases, erase operations of the media controller are implemented by firmware of the memory sub-system and the set of memory components is implemented on a memory die.

In some examples, the media controller, in response to initiating the erase operation, charges a bitline associated with a first portion of the plurality of portions and, after the bitline is charged, applies an erase pulse to the first portion of the plurality of portions. After the erase pulse is applied, the media controller discharges the bitline and suspends (automatically without receiving a specific suspend command from the memory controller or firmware) the erase operation to prevent erasing a second portion of the plurality of portions prior to performing the one or more read operations. The media controller initializes a forward progress slice counter. The media controller adjusts (increments or decrements) the forward progress slice counter as each slice of the first portion is being erased by the erase pulse. The media controller compares a value of the forward progress slice counter to the quantity of memory slices to erase and determines whether the value of the forward progress slice counter transgresses the quantity of memory slices to erase.

In some examples, in response to determining that the value of the forward progress slice counter transgresses the quantity of memory slices to erase, the media controller suspends the erase operation. In some examples, in response to determining that the value of the forward progress slice counter fails to transgress the quantity of memory slices to erase, the media controller erases another slice of the first portion.

In some examples, the media controller initializes an erase loop counter and adjusts (increments or decrements) the erase loop counter after each of the plurality of portions has been erased. In some cases, in response to determining that a value of the erase loop counter transgresses a threshold quantity, the media controller suspends the erase operation. In some cases, in response to determining that a value of the erase loop counter fails to transgress a threshold quantity, the media controller erases additional slices of the memory sub-system. In some examples, after the erase loop counter reaches a certain value or the threshold, a set of erase verify operations or phase is performed by the media controller.

Though various embodiments are described herein as being implemented with respect to a memory sub-system (e.g., a controller of the memory sub-system or media controller of individual memory dies), some or all of the portions of an embodiment can be implemented with respect to a host system, such as a software application or an operating system of the host system.

Figure 1:
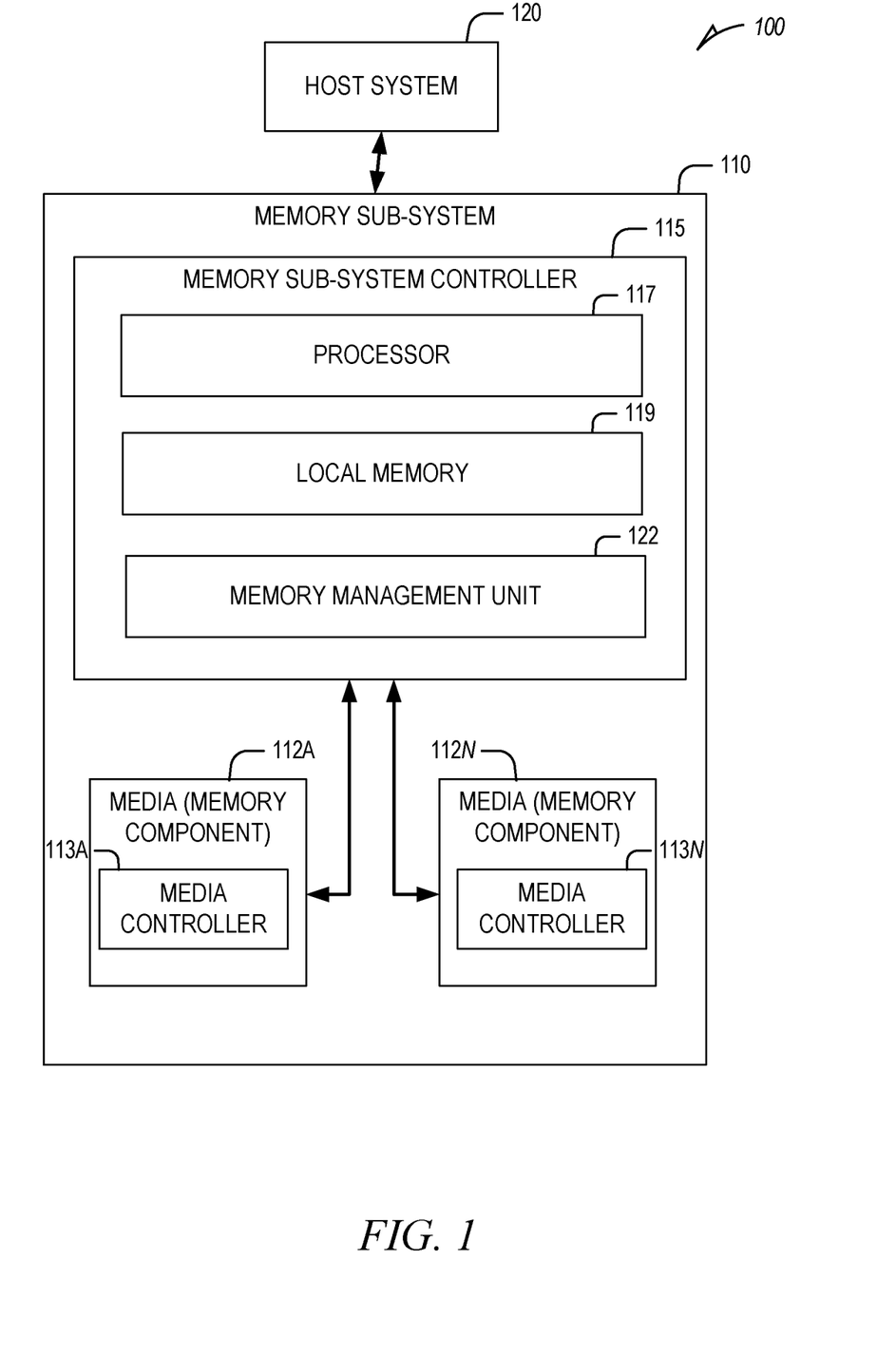
FIG. 1 is a block diagram illustrating an example computing environment including a memory sub-system, in accordance with some embodiments of the present disclosure.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. The memory components 112A to 112N can be implemented by individual memory dies, such that a first memory component 112A can be implemented by a first memory die (or a first collection of memory dies) and a second memory component 112N can be implemented by a second memory die (or a second collection of memory dies).

In some embodiments, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-systems 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120. The memory sub-system 110 can be implemented on a PCB that is coupled to the host system 120.

The memory components 112A to 112N can include any combination of the different types of non-volatile memory components and/or volatile memory components. An example of non-volatile memory components includes a negative-and (NAND)-type flash memory. Each of the memory components 112A to 112N can include one or more arrays of memory cells such as single-level cells (SLCs) or multi-level cells (MLCs) (e.g., TLCs or QLCs). In some embodiments, a particular one of the memory components 112A to 112N can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory. In some embodiments, the memory components 112A to 112N can be, but are not limited to, random access memory (RAM), read-only memory (ROM), dynamic random-access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells.

A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages, slices, or blocks that can refer to a unit of the memory component 112 used to store data.

The memory sub-system controller 115 can communicate with the memory components 112A to 112N to perform memory operations such as reading data, writing data, or erasing data at the memory components 112A to 112N and other such operations. The memory sub-system controller 115 can communicate with the memory components 112A to 112N to perform various memory management operations, such as different scan rates, different scan frequencies, different wear leveling, different read disturb management, different near miss ECC operations, and/or different dynamic data refresh. In some examples, the memory sub-system controller 115 can communicate with the memory components 112A to 112N to resume erase operations that have been automatically suspended by the memory components 112A to 112N.

The memory sub-system controller 115 can include hardware such as one or more integrated circuits and/or discrete components, a memory management unit 122, a buffer memory, and/or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and so forth. The local memory 119 can also include read-only memory (ROM) for storing microcode with instructions for the memory sub-system controller 115 to execute, such as firmware. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. The memory sub-system controller 115 can be responsible for other memory management operations, such as wear leveling operations, garbage collection operations, error detection and error-correcting code (ECC) operations, encryption operations, caching operations, memory components 112A to 112N initialization, and/or address translations using the memory management unit 122. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120. The memory sub-system controller 115 can include a memory interface to communicate with the memory components 112A to 112N. Any component included as part of the memory sub-system controller 115 can be included in the memory interface and vice versa.

The memory sub-system 110 can also include additional circuitry or components that are not illustrated. In some embodiments, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115, such as the memory management unit 122). The memory devices can be managed memory devices (e.g., managed NAND), which are raw memory devices combined with a local embedded controller (e.g., local media controllers) for memory management within the same memory device package. Any one of the memory components 112A to 112N can include a media controller (e.g., media controller 113A and media controller 113N) to manage the memory cells of the memory component (e.g., to perform one or more memory management operations), to communicate with the memory sub-system controller 115, and to execute memory requests (e.g., read or write) received from the memory sub-system controller 115.

In some examples, the memory management unit 122 and/or the media controllers 113A to 113N can include or have access to a configuration register (e.g., local memory 119) that enables dynamic and customized control over the duration of a forward progress erase suspend/resume approach to erasing memory devices, such as memory components 112A to 112N. In an example, the media controllers 113A to 113N and/or the memory management unit 122 can allow different applications or hosts to store and/or modify configuration information that specifies the total quantity of slices of memory that can be erased in each erase cycle. This way, forward progress of memory erasure can be maintained but also can be dynamically controlled based on the QoS needs of different applications. For example, the media controllers 113A to 113N can perform erasure operations (e.g., completing a BL charge, erase pulse, and BL discharge) with respect to a customized size or configurable quantity of memory slices and can automatically suspend performing the erasure operations to allow for one or more read operations to be serviced after the configurable quantity of memory slices have been erased. Then, when a resume command is received from the memory management unit 122, the media controllers 113A to 113N continue the previously initiated erase operation to continue erasing another quantity of memory slices. This enables multiple products to share the same NAND trim (or memory sub-system), but have different QoS for read requirements by allowing the different products to configure the forward progress erase suspend behavior. This increases the efficiency of operating memory systems by allowing the quantity of read operations serviced to be customized to the particular application or product rather than applying a one-size-fits-all approach to memory erase operations.

Depending on the embodiment, the memory management unit 122 and/or the media controllers 113A to 113N can comprise logic (e.g., a set of transitory or non-transitory machine instructions, such as firmware) or one or more components that causes the memory management unit 122 and/or the media controllers 113A to 113N to perform operations described herein. The memory management unit 122 and/or the media controllers 113A to 113N can comprise a tangible or non-tangible unit capable of performing operations described herein.

For example, the media controllers 113A to 113N (collectively or individually referred to as media controller 113) can initiate performing an erase operation. This can be done in response to an erase command received from the memory management unit 122 identifying a set of memory components (e.g., a set of blocks or slices) to be erased. The media controller 113 can access a configuration register which has been previously programmed with or stores configuration data received from the host system 120.

Figure 2:
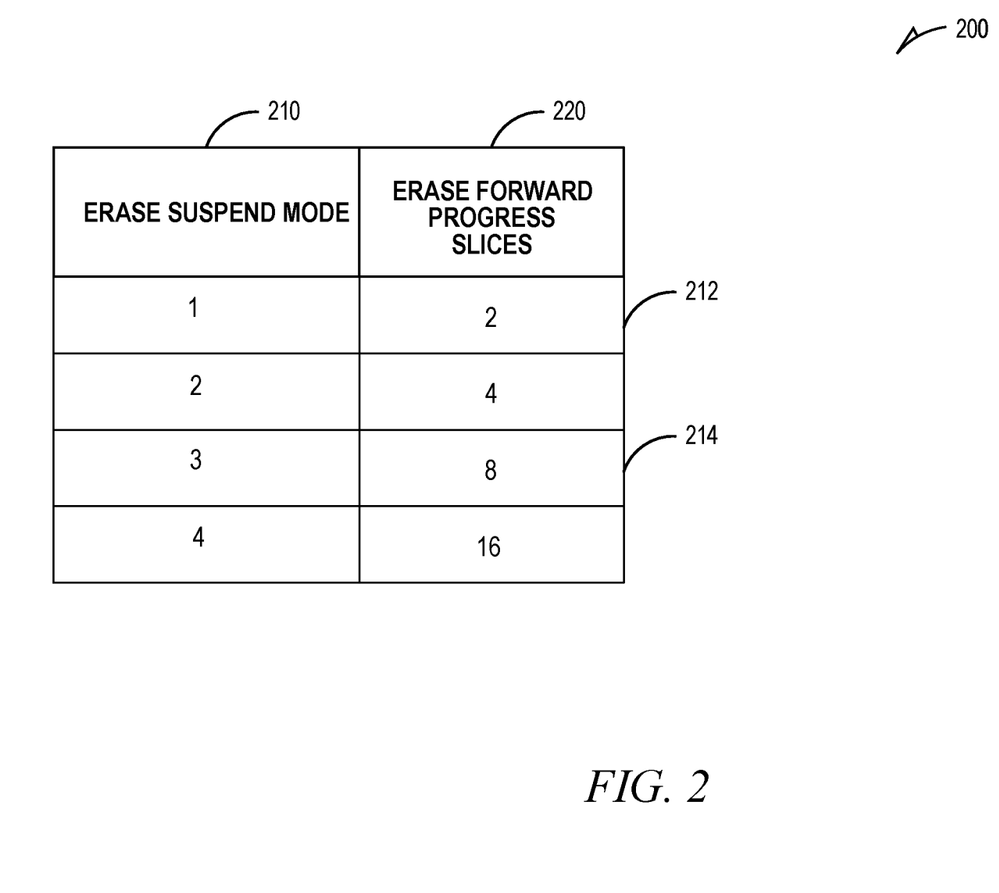
FIG. 2 is a diagram of an example configuration register of the memory sub-system, in accordance with some implementations of the present disclosure.

FIG. 2 is a diagram of an example configuration register 200 of the memory sub-system 110, in accordance with some implementations of the present disclosure. The configuration register 200 can include all or less than all of the fields shown in FIG. 2 and can be stored as part of the media controller 113 and/or the local memory 119. The configuration register 200 can include a first field 210 that stores a value representing an erase suspend mode corresponding to a particular configurable quantity of memory slices to erase and a second field 220 that identifies the configurable quantity of memory slices to erase.

An individual application can access the configuration register 200 to determine the different durations of times associated with different erase suspend modes. Based on the QoS needs of the individual application for having reads serviced by the memory sub-system 110, the individual application can programmatically select and/or store a given erase suspend mode by transmitting configuration information to the media controller 113 and/or the memory management unit 122. For example, a first application can store configuration information that selects a first erase suspend mode 212. In this mode, the media controller 113 can erase two memory slices during each erase cycle. This mode allows a first quantity of read operations to be serviced during each suspend portion of the erase cycle while a given collection of memory components 112A to 112N are being erased. In this mode, the media controller 113 can erase 8 memory slices during each erase cycle. This mode allows a second quantity of read operations to be serviced during each suspend portion of the erase cycle while a given collection of memory components 112A to 112N are being erased. In some examples, the second application can have read requests serviced less often or less frequently than the first application. Namely, the second mode services read requests less frequently than the first mode but between each time the read requests are serviced, a greater quantity of memory slices are erased by the media controller 113. Because the second mode erases a greater quantity of memory slices in a given collection, the second mode completes erasing the given collection of memory slices in less time than the first mode.

Figure 3:
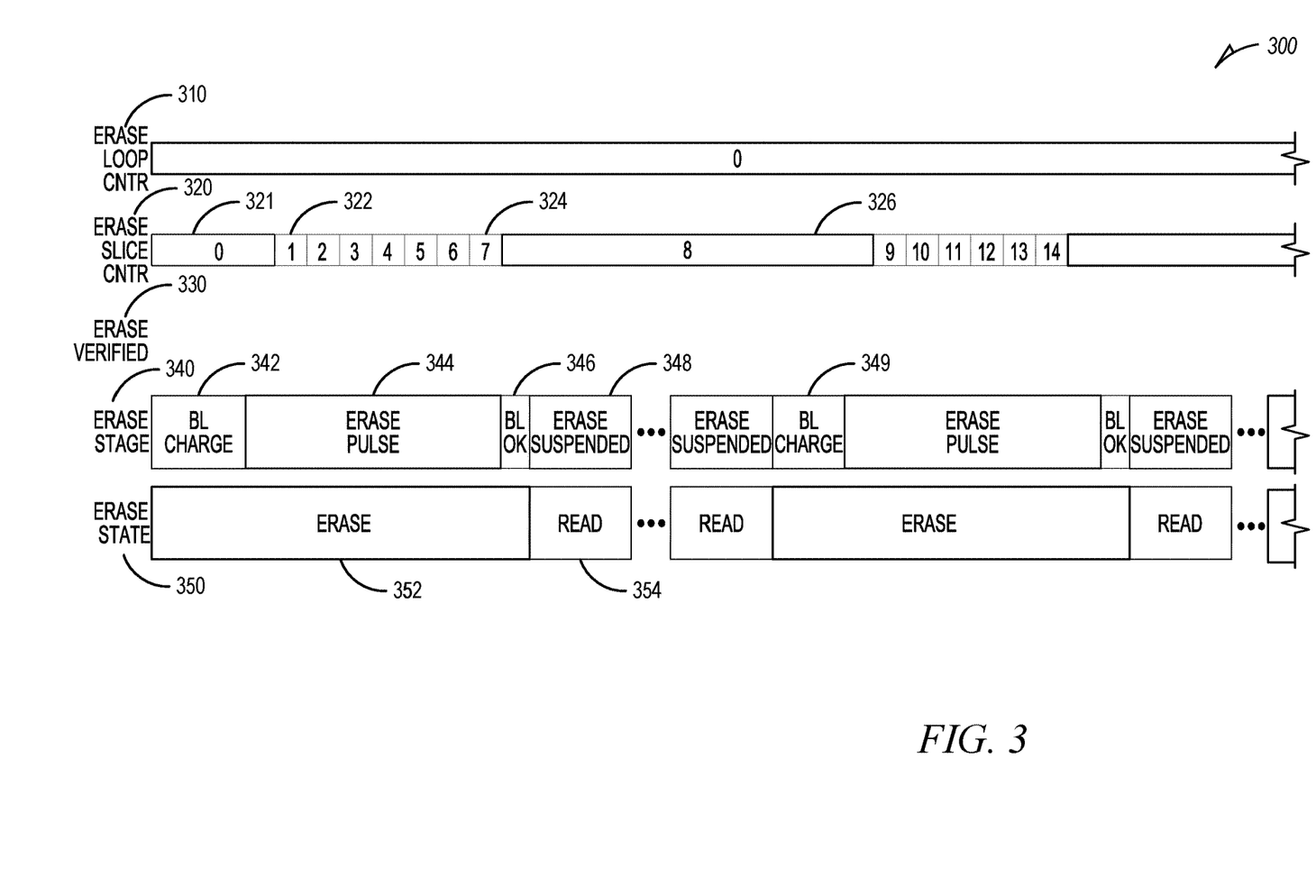
FIG. 3 is an example timing diagram of example erase suspend operations, in accordance with some implementations of the present disclosure.

FIG. 3 is an example timing diagram 300 of example erase suspend operations, in accordance with some implementations of the present disclosure. Specifically, the timing diagram 300 illustrates the operations performed by the media controller 113 in erasing an individual collection of memory slices (e.g., 16 slices) of a memory component 112. The timing diagram 300 is for one erase loop shown by erase loop counter 310.

In some examples, the media controller 113A receives a request to perform an erase operation for the collection of memory slices from the memory management unit 122. In response, the media controller 113A accesses the configuration register 200 to determine the erase mode that is currently set or selected for the memory component 112A. Based on the erase mode, the media controller 113A obtains the quantity of memory slices or portions of the memory component 112A associated with the erase mode from the configuration register 200. For example, the quantity of memory slices or portions can be 8. The media controller 113A enters a state machine state 350 to an erase state 352 in which no other operations can be performed by the media controller 113A except erase operations.

The media controller 113A initializes a forward progress slice counter and an erase slice counter, such as by setting each counter to zero. For example, as shown in the timing diagram 300, the erase slice counter 320 is initialized to an initial value 321 (e.g., the value 0). The erase slice counter 320 tracks how many memory slices in the collection of memory slices to be erased have been erased. The forward progress slice counter tracks how many memory slices have been erased in a given loop to automatically suspend further erasure of memory slices.

The media controller 113A enters the erase phase 340 corresponding to BL charge 342 in which the bitline associated with the individual collection of memory slices is charged up to a specified voltage level. Once the BL charge is completed, the media controller 113A enters the erase pulse phase 344. During the erase pulse phase 344, the media controller 113A applies the voltage from the bitline to respective slices in the collection of slices that are being erased. For example, the media controller 113A applies the erase pulse to a first memory slice of the collection of memory slices. Then, the media controller 113A increments or adjusts the erase slice counter 320 after the first memory slice has been erased and increments or adjusts the forward progress slice counter.

The media controller 113A compares the current value of the erase slice counter 320 to total quantity of memory slices to be erased in a collection and compares the forward progress slice counter to the quantity of memory slices or portions of the memory component 112A associated with the selected erase mode. For example, the media controller 113A compares the current erase slice counter 320 value to a threshold quantity of 16 slices and compares the forward progress slice counter to the quantity of memory slices (8) to erase per loop stored in the configuration register 200. In response to determining that the current erase slice counter 320 value is less than the threshold quantity of 16 slices (e.g., fails to transgress the threshold quantity of slices) or that the forward progress slice counter is less than the quantity of memory slices 8 to erase per loop stored in the configuration register 200, the media controller 113A applies the erase pulse to a second memory slice of the collection of memory slices.

Then, the media controller 113A increments or adjusts the erase slice counter 320 after the second memory slice has been erased and increments or adjusts the forward progress slice counter. The media controller 113A compares the current value forward progress slice counter to the quantity of memory slices or portions of the memory component 112A associated with the selected erase mode (e.g., 8 slices). The media controller 113A also compares the current value 322 of the erase slice counter 320 to the quantity of memory slices in the collection of memory slices to be erased (e.g., 16 slices). For example, the media controller 113A compares the current erase slice counter 320 value to a threshold quantity of 16 memory slices. The media controller 113A continues applying the erase pulse to a sequential set of memory slices in the collection of memory slices until either the current erase slice counter 320 reaches a value 324 that corresponds to or transgresses the threshold quantity of slices in the collection of memory slices to be erased or until the forward progress slice counter reaches the quantity of memory slices (8) to erase per loop stored in the configuration register 200 for the selected mode.

In response to determining that the forward progress slice counter value is greater than the threshold quantity of 8 slices (e.g., transgresses the threshold quantity of slices), the media controller 113A enters the BL discharge phase 346. Once the BL discharge phase 346 is completed, the media controller 113A updates the state machine state 350 to the read state 354 and also automatically enters the erase suspend phase 348. During the read state 354, the media controller 113A can service one or more read operations. During the erase suspend phase 348 subsequent portions of the previously identified collection of memory slices to be erased are paused from being erased and are not erased.

The media controller 113A can receive a resume erase command from the memory management unit 122 after servicing or completing the one or more read operations. In response to receiving the resume erase command, the media controller 113A can re-enter the erase state 352. The media controller 113A also enters the BL charge phase 349 and re-initializes the forward progress counter (the erase slice counter 320 remains at the previously stored value to identify the last memory slice that has been erased on the collection of memory slices). The media controller 113A, in response to the resume erase command, begins erasing the subsequent memory slices in the collection of memory slices after the BL charge phase 349 completes. Particularly, the media controller 113A applies the erase pulse to a ninth memory slice 326 of the collection of memory slices after previously suspending erase operations when the eighth memory slice was erased (e.g., when the forward progress counter reached the threshold quantity of memory slices of the selected erase mode).

Then, the media controller 113A increments or adjusts the erase slice counter 320 after the ninth memory slice has been erased and increments or adjusts the forward progress counter. The media controller 113A compares the current value of the erase slice counter 320 to the quantity of memory slices in the collection of memory slices to be erased. The media controller 113A continues applying the erase pulse to a sequential set of memory slices in the collection of memory slices until the current erase slice counter 320 reaches a value that corresponds to or transgresses the quantity of memory slices in the collection of memory slices to be erased. At that point, the media controller 113A automatically suspends erase operations and allows read operations to be performed. Also, in response to the value of the erase slice counter 320 corresponding to or transgressing the quantity of memory slices in the collection of memory slices to be erased, the media controller 113A performs an erase verification 330 for the collection of memory slices.

In this way, an erase operation can be suspended when either of two conditions are met. The erase operation can be automatically suspended to service one or more read operations when a configurable quantity of memory slices are erased. In such cases, the erase operation is suspended without performing erase verification on a collection of memory slices. In another case, the erase operation can be automatically suspended to service one or more read operations when a maximum quantity of memory slices in a collection of memory slices is reached. At this point, the erase verification operation is performed by the media controller 113.

Figure 4:
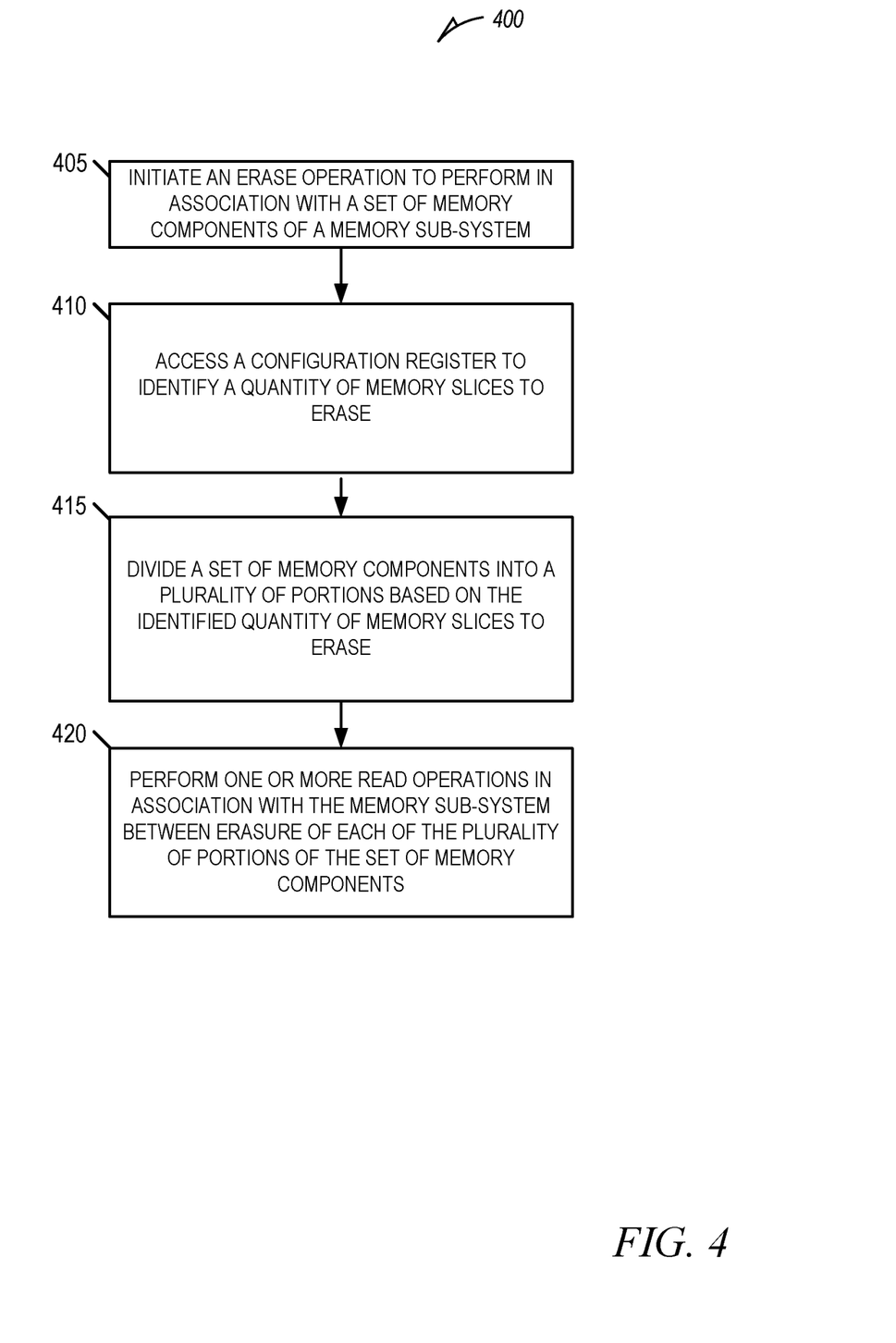
FIG. 4 is a flow diagram of an example method to perform erase suspend management, in accordance with some implementations of the present disclosure.

FIG. 4 is a flow diagram of an example method 400 to perform erase suspend management, in accordance with some implementations of the present disclosure. The method 400 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 400 is performed by the respective media controllers 113A to 113N of FIG. 1. In some embodiments, the method 400 is performed by the memory management unit 122 separately or in combination with the respective media controllers 113A to 113N of FIG. 1. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now to FIG. 4, the method (or process) 400 begins at operation 405, with a media controllers 113A to 113N of a memory sub-system (e.g., memory sub-system 110) initiating an erase operation to perform in association with a set of memory components 112A to 112N of a memory sub-system. Any references to media controllers 113A to 113N pertain to operations performed by a single instance of the media controller 113A or multiple instances of media controllers 113A to 113N in parallel on respective memory dies. Then, at operation 410, the media controllers 113A to 113N access a configuration register to identify a quantity of memory slices to erase. The media controllers 113A to 113N divide a set of memory components 112A to 112N into a plurality of portions based on the identified quantity of memory slices to erase at operation 415. For example, the media controller 113A divides the set of memory components 112A into a first plurality of portions based on the identified quantity of memory slices to erase and the media controller 113N divides the set of memory components 112N into a second plurality of portions based on the identified quantity of memory slices to erase. The media controllers 113A to 113N, at operation 420, perform one or more read operations in association with the memory sub-system between erasure of each of the plurality of portions of the set of memory components.

In view of the disclosure above, various examples are set forth below. It should be noted that one or more features of an example, taken in isolation or combination, should be considered within the disclosure of this application.

Example 1: a system comprising: a set of memory components of a memory sub-system; and a processing device operatively coupled to the set of memory components, the processing device being configured to perform operations comprising: accessing a configuration register to identify a quantity of memory slices to erase; dividing the set of memory components into a plurality of portions based on the identified quantity of memory slices to erase; and performing one or more read operations in association with the memory sub-system between erasure of each of the plurality of portions of the set of memory components.

Example 2: the system of Example 1 wherein the operations comprise: applying a first erase pulse to a first portion of the plurality of portions; suspending the erase operation associated with the set of memory components; performing the one or more read operations; and after performing the one or more read operations, applying a second erase pulse to a second portion of the plurality of portions.

Example 3: the system of Examples 1 or 2, wherein the operations comprise initiating an erase operation to perform in association with the set of memory components, and wherein sizes of each of the plurality of portions are equal.

Example 4: the system of any one of Examples 1-3, wherein the erase operation corresponds to erasing 16 memory slices, each of the plurality of portions corresponding to a subset of the 16 memory slices.

Example 5: the system of any one of Examples 1-4, wherein the operations comprise: receiving configuration information from a host specifying the quantity of memory slices; and storing the configuration information in the configuration register.

Example 6: the system of any one of Examples 1-5, wherein the processing device and the set of memory components are implemented on a same memory die.

Example 7: the system of any one of Examples 1-6, wherein the processing device is implemented by firmware of the memory sub-system, and wherein the set of memory components is implemented on a memory die.

Example 8: the system of any one of Examples 1-7, wherein the operations comprise: in response to initiating the erase operation, charging a bitline associated with a first portion of the plurality of portions; after the bitline is charged, applying an erase pulse to the first portion of the plurality of portions; after the erase pulse is applied, discharging the bitline; and suspending the erase operation to prevent erasing a second portion of the plurality of portions prior to performing the one or more read operations.

Example 9: the system of Example 8, wherein the operations comprise: initializing a forward progress slice counter; adjusting the forward progress slice counter as each slice of the first portion is being erased by the erase pulse; comparing a value of the forward progress slice counter to the quantity of memory slices to erase; and determining whether the value of the forward progress slice counter transgresses the quantity of memory slices to erase.

Example 10: the system of Example 9, wherein the operations comprise: in response to determining that the value of the forward progress slice counter transgresses the quantity of memory slices to erase, suspending the erase operation.

Example 11: the system of any one of Examples 1-9, wherein the operations comprise: in response to determining that the value of the forward progress slice counter fails to transgress the quantity of memory slices to erase, erasing another slice of the first portion.

Example 12: the system of any one of Examples 1-11, wherein the operations comprise: initializing an erase loop counter; and adjusting the erase loop counter after each of the plurality of portions has been erased.

Example 13: the system of Example 12, wherein the operations comprise: in response to determining that a value of the erase loop counter transgresses a threshold quantity representing a maximum quantity of memory slices in a collection of memory slices: suspending the erase operation; and performing erase verification of the plurality of portions of the set of memory components.

Example 14: the system of any one of Examples 1-13, wherein the operations comprise: in response to determining that a value of the erase loop counter fails to transgress a threshold quantity, erasing additional slices of the memory sub-system.

Methods and computer-readable storage medium with instructions for performing any one of the above Examples.

Figure 5:
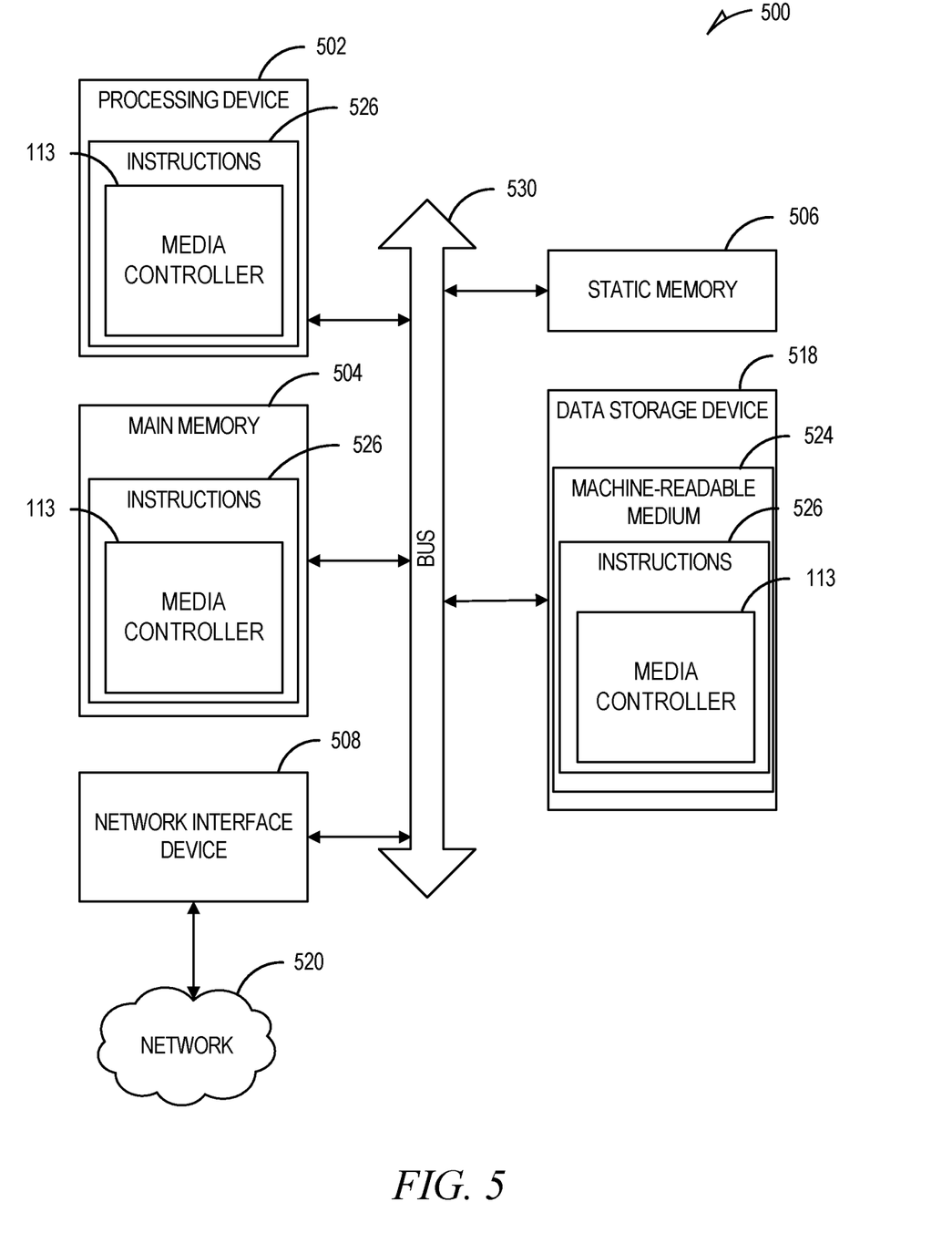
FIG. 5 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 5 illustrates an example machine in the form of a computer system 500 within which a set of instructions can be executed for causing the machine to perform any one or more of the methodologies discussed herein. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media controllers 113A to 113N, a single instance of the media controller 113A and/or memory management unit 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device 502 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), a network processor, or the like. The processing device 502 is configured to execute instructions 526 for performing the operations and steps discussed herein. The computer system 500 can further include a network interface device 508 to communicate over a network 520.

The data storage system 518 can include a machine-readable storage medium 524 (also known as a computer-readable medium) on which is stored one or more sets of instructions 526, or software embodying any one or more of the methodologies or functions described herein. The instructions 526 can also reside, completely or partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 implement functionality corresponding to the media controllers 113A to 113N of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work most effectively to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a set of memory components of a memory sub-system; and
   a processing device operatively coupled to the set of memory components, the processing device being configured to perform operations comprising:
      accessing a configuration register to identify a quantity of memory slices to erase;
      dividing the set of memory components into a plurality of portions based on the identified quantity of memory slices to erase; and
      performing one or more read operations in association with the memory sub-system between erasure of each of the plurality of portions of the set of memory components.

2. The system of claim 1, wherein the operations comprise:
applying a first erase pulse to a first portion of the plurality of portions;
suspending the erase operation associated with the set of memory components;
performing the one or more read operations; and
after performing the one or more read operations, applying a second erase pulse to a second portion of the plurality of portions.

3. The system of claim 1, wherein the operations comprise initiating an erase operation to perform in association with the set of memory components, wherein sizes of each of the plurality of portions are equal.

4. The system of claim 1, wherein the erase operation corresponds to erasing 16 memory slices, each of the plurality of portions corresponding to a subset of the 16 memory slices.

5. The system of claim 1, wherein the operations comprise:
receiving configuration information from a host specifying the quantity of memory slices; and
storing the configuration information in the configuration register.

6. The system of claim 1, wherein the processing device and the set of memory components are implemented on a same memory die.

7. The system of claim 1, wherein the processing device is implemented by firmware of the memory sub-system, and wherein the set of memory components is implemented on a memory die.

8. The system of claim 1, wherein the operations comprise:
in response to initiating the erase operation, charging a bitline associated with a first portion of the plurality of portions;
after the bitline is charged, applying an erase pulse to the first portion of the plurality of portions;
after the erase pulse is applied, discharging the bitline; and
suspending the erase operation to prevent erasing a second portion of the plurality of portions prior to performing the one or more read operations.

9. The system of claim 8, wherein the operations comprise:
initializing a forward progress slice counter;
adjusting the forward progress slice counter as each slice of the first portion is being erased by the erase pulse;
comparing a value of the forward progress slice counter to the quantity of memory slices to erase; and
determining whether the value of the forward progress slice counter transgresses the quantity of memory slices to erase.

10. The system of claim 9, wherein the operations comprise:
in response to determining that the value of the forward progress slice counter transgresses the quantity of memory slices to erase, suspending the erase operation.

11. The system of claim 9, wherein the operations comprise:
in response to determining that the value of the forward progress slice counter fails to transgress the quantity of memory slices to erase, erasing another slice of the first portion.

12. The system of claim 1, wherein the operations comprise:
initializing an erase loop counter; and
adjusting the erase loop counter after each of the plurality of portions has been erased.

13. The system of claim 12, wherein the operations comprise:
in response to determining that a value of the erase loop counter transgresses a threshold quantity representing a maximum quantity of memory slices in a collection of memory slices:
suspending the erase operation; and
performing erase verification of the plurality of portions of the set of memory components.

14. The system of claim 12, wherein the operations comprise:
in response to determining that a value of the erase loop counter fails to transgress a threshold quantity, erasing additional slices of the memory sub-system.

15. A computerized method comprising:
accessing a configuration register to identify a quantity of memory slices to erase;
dividing a set of memory components into a plurality of portions based on the identified quantity of memory slices to erase; and
performing one or more read operations in association with a memory sub-system between erasure of each of the plurality of portions of the set of memory components.

16. The method of claim 15, further comprising:
applying a first erase pulse to a first portion of the plurality of portions;
suspending the erase operation associated with the set of memory components;
performing the one or more read operations; and
after performing the one or more read operations, applying a second erase pulse to a second portion of the plurality of portions.

17. The method of claim 15, wherein sizes of each of the plurality of portions are equal.

18. A non-transitory computer-readable storage medium comprising instructions that, when executed by a processing device, cause the processing device to perform operations comprising:
accessing a configuration register to identify a quantity of memory slices to erase;
dividing a set of memory components into a plurality of portions based on the identified quantity of memory slices to erase; and
performing one or more read operations in association with a memory sub-system between erasure of each of the plurality of portions of the set of memory components.

19. The non-transitory computer-readable storage medium of claim 18, further comprising:
applying a first erase pulse to a first portion of the plurality of portions;
suspending the erase operation associated with the set of memory components;
performing the one or more read operations; and
after performing the one or more read operations, applying a second erase pulse to a second portion of the plurality of portions.

20. The non-transitory computer-readable storage medium of claim 18, wherein sizes of each of the plurality of portions are equal.

* * * * *